(12) United States Patent
Song

(10) Patent No.: US 9,129,694 B2
(45) Date of Patent: Sep. 8, 2015

(54) SLEW RATE MODULATION

(71) Applicant: Micron Technology, Inc., Boise, ID (US)

(72) Inventor: Daesik Song, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/567,903

(22) Filed: Dec. 11, 2014

(65) Prior Publication Data
US 2015/0092499 A1 Apr. 2, 2015

Related U.S. Application Data

(63) Continuation of application No. 13/316,167, filed on Dec. 9, 2011, now Pat. No. 8,917,131.

(51) Int. Cl.
| | | |
|---|---|---|
| *H03K 5/12* | (2006.01) | |
| *G11C 16/24* | (2006.01) | |
| *H03K 19/00* | (2006.01) | |
| *H03K 19/0185* | (2006.01) | |
| *G11C 7/12* | (2006.01) | |

(52) U.S. Cl.
CPC ...... *G11C 16/24* (2013.01); *G11C 7/12* (2013.01); *H03K 19/0027* (2013.01); *H03K 19/018528* (2013.01); *H03K 19/018585* (2013.01)

(58) Field of Classification Search
USPC ........ 327/108–112, 170–175; 326/82, 83, 87, 326/26, 27
See application file for complete search history.

(56) References Cited

U.S. PATENT DOCUMENTS

| | | | |
|---|---|---|---|
| 6,047,346 | A | 4/2000 | Lau et al. |
| 6,320,437 | B1 | 11/2001 | Ma |
| 6,744,287 | B2 | 6/2004 | Mooney et al. |
| 7,116,141 | B2 | 10/2006 | Demone |
| 7,187,721 | B1 | 3/2007 | Dally et al. |
| 7,317,333 | B1 | 1/2008 | Zhou et al. |
| 7,777,538 | B2 * | 8/2010 | Abel et al. ............... 327/144 |
| 2007/0057723 | A1 * | 3/2007 | Pan et al. ............... 330/252 |
| 2008/0106297 | A1 | 5/2008 | Jao |
| 2010/0253384 | A1 * | 10/2010 | Sohn ...................... 326/27 |
| 2013/0147532 | A1 | 6/2013 | Song |

* cited by examiner

*Primary Examiner* — Lincoln Donovan
*Assistant Examiner* — Thomas Skibinski
(74) *Attorney, Agent, or Firm* — Dorsey & Whitney LLP

(57) ABSTRACT

Apparatus and methods may operate so that arrival times of a data signal at gates of transistors are controlled to switch the transistors at different times to modulate the slew rate of a signal on a node. Additional embodiments are also described.

20 Claims, 11 Drawing Sheets

SLEW RATE MODULATION

CROSS-REFERENCE TO RELATED APPLICATION(S)

This application is a continuation of U.S. patent application Ser. No. 13/316,167 filed Dec. 9, 2011, and issued as U.S. Pat. No. 8,917,131 on Dec. 23, 2014. This application and patent are incorporated herein by reference, in their entirety, for any purpose.

BACKGROUND

Non-volatile semiconductor memories (NVSMs) are widely used in electronic devices such as personal digital assistants (PDAs), laptop computers, mobile phones and digital cameras. A NVSM can transmit data to a bus at substantial rates.

BRIEF DESCRIPTION OF THE DRAWINGS

Some embodiments are illustrated by way of example and not limitation in the figures of the accompanying drawings in which.

DETAILED DESCRIPTION OF PREFERRED EMBODIMENTS

An array of charge storage devices according to various embodiments of the invention may function as an array of memory cells in a memory device such as a NOT AND (NAND) memory device.

In this description, a transistor is described as being switched on to assume an activated state when it is rendered conductive by a control gate voltage that is separated from its source voltage by at least its threshold voltage. The transistor is described as being switched off to assume an inactive state when the difference between the control gate voltage and the source voltage is less than the threshold voltage, so that the transistor is rendered non-conductive.

A slew rate is the rate of change of voltage (voltage change/time) that a driver circuit can provide (e.g., generate) at a data (DQ) node when the driver circuit is changing a signal it is driving on the DQ node. The driver circuit may change the signal from logic low to logic high or logic high to logic low. The slew rate may be further specified as a rise time or a fall time of the signal.

The slew rate can be modulated responsive to a control signal on a gate of a driver circuit. This slew rate can be inconsistent, however, if there is a skewed edge in the control signal. The inconsistent slew rate can require limiting the frequency of data transmission from the DQ node. This can limit data access time. The inventor has discovered that such challenges, as well as others, can at least sometimes be addressed by, for example, controlling the arrival times of a data signal to switch (e.g., on or off) multiple driver circuits at different times to modulate the slew rate at the DQ node. The arrival times of the data signal can be controlled using individually delayed timing signals from a timing circuit. The timing circuit can be disabled if the desired mode of operation does not require slew rate modulation.

Data can be transmitted from a device (e.g. a NAND memory device), using different modes such as, for example, an asynchronous single data rate (SDR) mode and a synchronous double data rate (DDR) mode. A data output cycle time is slower in the SDR mode than in the DDR mode and there can be no slew rate specification for the SDR mode. Data can be requested with a faster access time in the SDR mode than in the DDR mode, which has a slew rate specification. A device transmitting data may be asked to switch between the SDR mode and the DDR mode on the fly.

Figure 1:
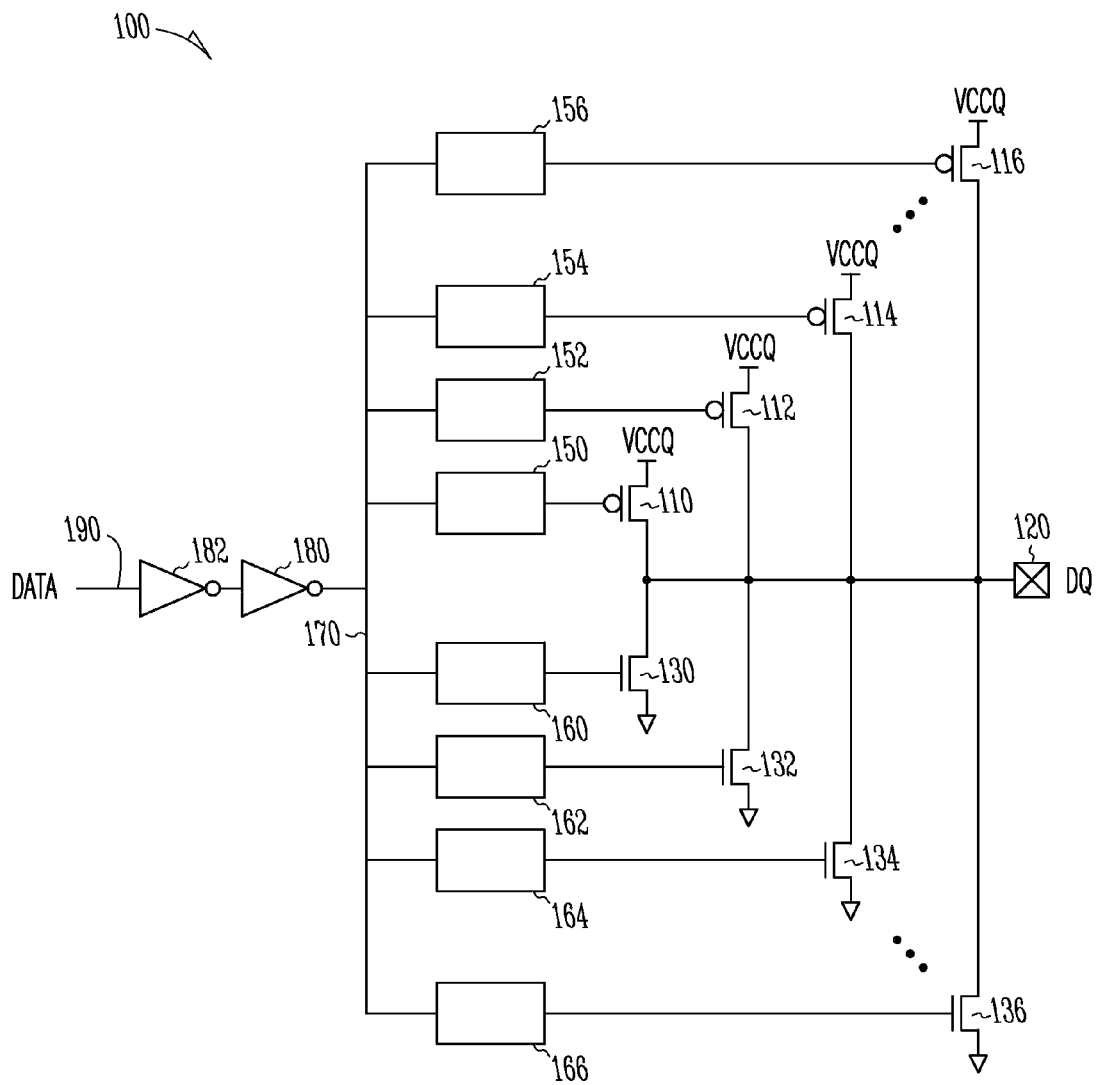
FIG. 1 is an electrical schematic diagram of an apparatus in the form of a driver circuit according to various embodiments of the invention.

FIG. 1 is an electrical schematic diagram of an apparatus in the form of a driver circuit 100 according to various embodiments of the invention. The driver circuit 100 includes four p-channel transistors 110, 112, 114 and 116 coupled to an external node 120 (e.g., a node used to couple the driver circuit 100 to another circuit and/or device, such as an input and/or output node, a terminal, a bond pad, a connection, etc.). The p-channel transistors 110, 112, 114 and 116 are coupled in parallel between the external node 120 and a supply voltage VCCQ node. The supply voltage VCCQ can be received from a source external to a device that includes the driver circuit 100. A plurality of n-channel transistors 130, 132, 134 and 136 are similarly coupled in parallel between the external node 120 and a reference (e.g., ground voltage) node.

Each of the p-channel transistors 110, 112, 114 and 116 has a gate coupled to a respective pull-up circuit 150, 152, 154 and 156. Each of the n-channel transistors 130, 132, 134 and 136 has a gate coupled to a respective pull-down circuit 160, 162, 164 and 166. Each pull-up circuit 150, 152, 154 and 156 and each pull-down circuit 160, 162, 164 and 166 can receive a data signal DATA on a bus line 170 that has been inverted twice by two inverters 180 and 182 after having been received on a bus line 190. Each pull-up circuit 150, 152, 154 and 156 and each pull-down circuit 160, 162, 164 and 166 can provide a respective control signal to a gate of a respective one of the transistors 110, 112, 114, 116, 130, 132, 134 and 136 to switch the transistor on or off to drive the data signal on the external node 120.

The driver circuit 100 can drive a signal on the external node 120 to a logic high when one or more of the p-channel transistors 110, 112, 114 and 116 are switched on to couple the external node 120 to VCCQ and the n-channel transistors 130, 132, 134 and 136 are all switched off. The driver circuit 100 can drive a signal on to the external node 120 to a logic low when one or more of the n-channel transistors 130, 132, 134 and 136 are switched on to couple the external node 120 to the ground voltage and the p-channel transistors 110, 112, 114 and 116 are all switched off.

The p-channel transistors 110, 112, 114 and 116 can have the same size or can have different sizes. Likewise, the n-channel transistors 130, 132, 134 and 136 can have the same size or can have different sizes. There may be more or less than four p-channel transistors connected in parallel between the external node 120 and the supply voltage VCCQ node. There may also be more or less than four n-channel transistors connected in parallel between the external node 120 and the reference node. The impedances of the p-channel transistors 110, 112, 114 and 116 and the n-channel transistors 130, 132, 134 and 136 can be substantially equal or not equal to each other.

Figure 2:
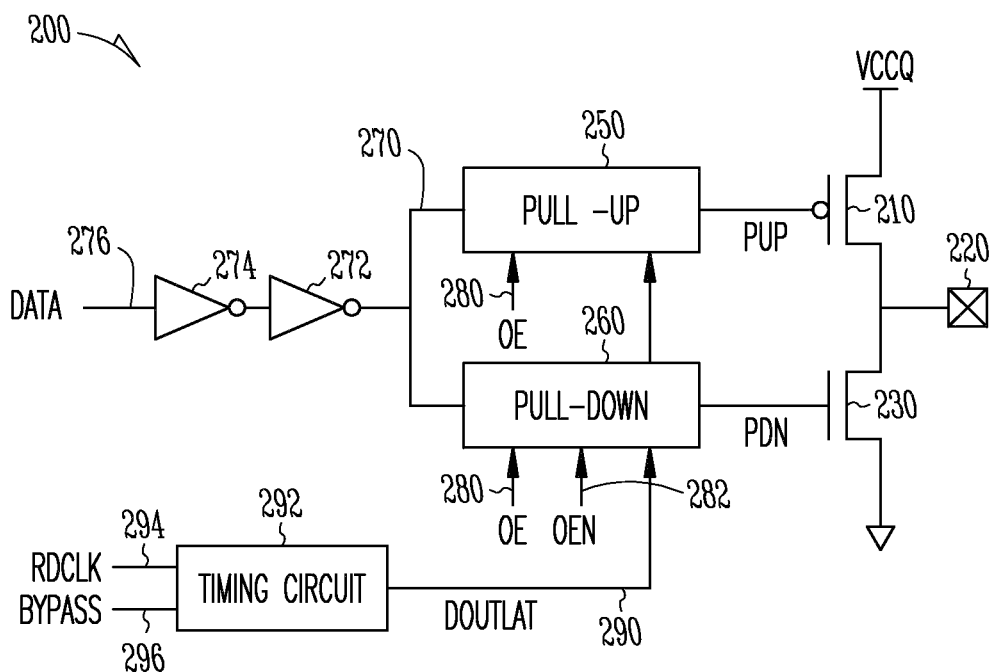
FIG. 2 is an electrical schematic diagram of an apparatus in the form of a driver circuit according to various embodiments of the invention.

FIG. 2 is an electrical schematic diagram of an apparatus in the form of a driver circuit 200 according to various embodiments of the invention. The driver circuit 200 can form a portion of the driver circuit 100 shown in FIG. 1. The driver circuit 200 includes a p-channel transistor 210 having a drain coupled to an external node 220 and source coupled to a supply voltage VCCQ node. The supply voltage VCCQ is received from an external source in a device including the driver circuit 200. An n-channel transistor 230 has a drain coupled to the external node 220 and a source coupled to a reference (e.g., ground voltage) node.

A gate of the p-channel transistor 210 is coupled to a pull-up circuit 250. A gate of the n-channel transistor 230 is coupled to a pull-down circuit 260. The pull-up circuit 250 and the pull-down circuit 260 can each receive a data signal DATA on a line 270 that has been inverted twice by two inverters 272 and 274 after having been received on a line 276. The pull-up circuit 250 can provide a control signal PUP to the gate of the p-channel transistor 210 to switch the p-channel transistor 210 to provide VCCQ on the external node 220. The pull-down circuit 260 can provide the control signal PDN to the gate of the re-channel transistor 230 to switch the n-channel transistor 230 to provide the ground voltage on the external node 120.

The pull-up circuit 250 and the pull-down circuit 260 can each receive an output enable signal (OE) on a line 280, and the pull-down circuit 260 can also receive an output enable not signal (OEN) on a line 282. The output enable signal OE is a digital signal that can enable the pull-up circuit 250 and the pull-down circuit 260. The output enable not signal OEN is a digital signal that is the inverse of the output enable signal OE. The output enable not signal OEN can enable the pull-down circuit 260. The pull-up circuit 250 and the pull-down circuit 260 can also each receive timing signals. In at least some embodiments, the timing signals received by the pull-up and pull-down circuits 250, 260 are the same timing signal DOUTLAT provided on a line 290 from a single timing circuit 292. The timing circuit 292 is coupled to a line 294 to receive a read clock signal (RDCLK), and is coupled to a line 296 to receive an enable signal BYPASS. The RDCLK signal can be a buffered and gated clock signal. The pull-up circuit 250, the pull-down circuit 260 and the timing circuit 292 will be further described below.

The p-channel transistor 210 and the n-channel transistor 230 represent a pair of pull-up/pull-down transistors coupled to the external node 220. The pair of pull-up/pull-down transistors 210 and 230 can be one of the pairs of pull-up/pull-down transistors 110 and 130, 112 and 132, 114 and 134 and 116 and 136 of the driver circuit 100 shown in FIG. 1. The pull-up circuit 250 and the pull-down circuit 260 are a pair of pull-up/pull-down circuits that can be one of the pairs of pull-up/pull-down circuits 150 and 160, 152 and 162, 154 and 164 and 156 and 166 of the driver circuit 100 shown in FIG. 1. Each pair of pull-up/pull-down circuits 150 and 160, 152 and 162, 154 and 164 and 156 and 166 is coupled to a single timing circuit (not shown) such as the timing circuit 292 to receive the same timing signal DOUTLAT.

Figure 3:
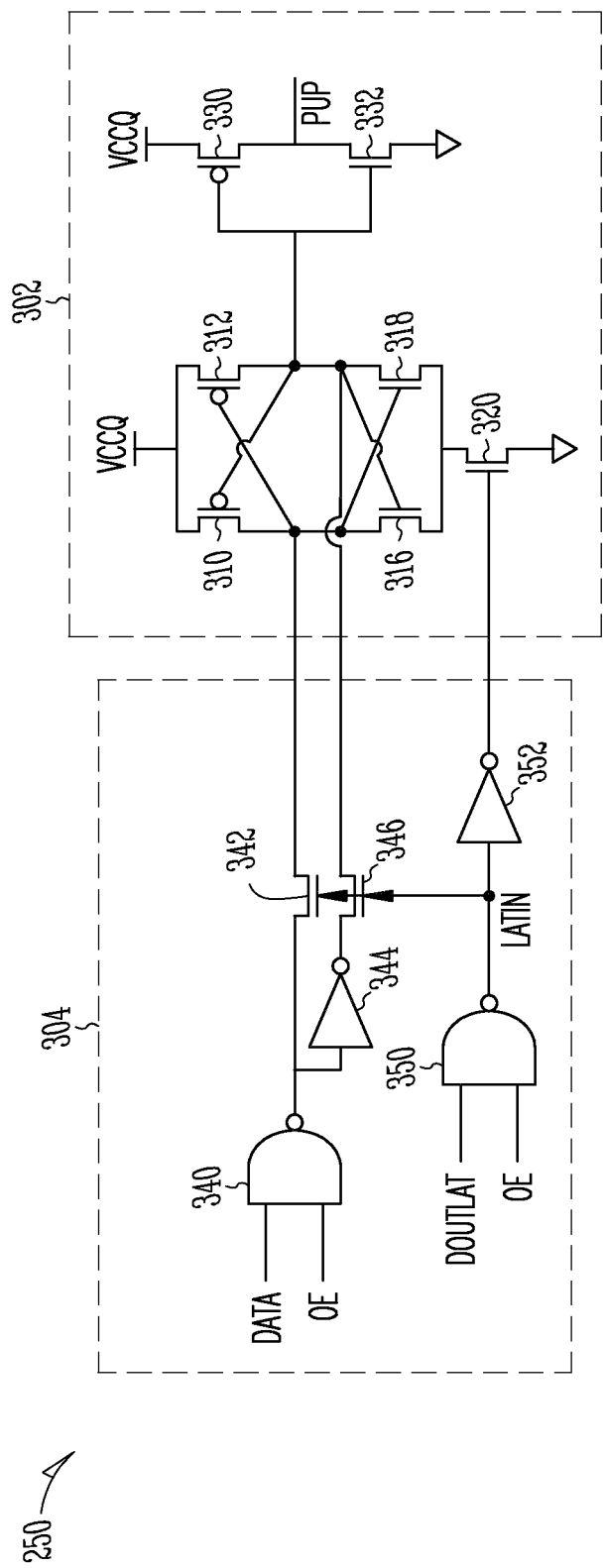
FIG. 3 is an electrical schematic diagram of an apparatus in the form of a pull-up circuit according to various embodiments of the invention.

FIG. 3 is an electrical schematic diagram of an apparatus in the form of the pull-up circuit 250 according to various embodiments of the invention. The pull-up circuit 250 is shown in FIG. 2 and includes a latch 302 and logic 304. The latch 302 includes a p-channel transistor 310 having a source coupled to a source of a p-channel transistor 312 and a VCCQ node. A drain of the p-channel transistor 310 is coupled to a drain of an n-channel transistor 316, and a drain of the p-channel transistor 312 is coupled to a drain of an re-channel transistor 318. Sources of the re-channel transistors 316 and 318 are coupled together to a drain of an n-channel transistor 320, and a source of the n-channel transistor 320 is coupled to a reference (e.g., ground voltage) node. The transistors 310, 312, 316 and 318 are cross-coupled to latch a potential from the logic 304 as described below. During operation, the drains of the transistors 312 and 318 can have a latched potential that is provided to gates of a p-channel transistor 330 and an n-channel transistor 332.

A source of the p-channel transistor 330 is coupled to a VCCQ node and a drain of the p-channel transistor 330 is coupled to a drain of the n-channel transistor 332. A source of the n-channel transistor 332 is coupled to the reference node. The transistors 330 and 332 function as an inverter to invert the potential on the drains of the transistors 312 and 318 into a control signal PUP on the drains of the transistors 330 and 332. The latch 302 receives VCCQ while the logic receives a regulated voltage VCCR (not shown), which can be generated from a supply voltage VCC in a device that receives VCC from an external source. The device in which VCCR is generated includes the driver circuit 200. VCCR is stable (i.e., it remains at substantially the same value while the driver circuit 200 operates) and may be of a lower value than VCC.

The state of control signal PUP is determined by logic 304 that includes a NAND gate 340 that receives the data signal DATA and the output enable signal OE on separate inputs. An output of the NAND gate 340 is coupled to a drain of an n-channel transistor 342 and an input of an inverter 344. A source of the n-channel transistor 342 is coupled to the drain of the p-channel transistor 310 and a gate of the p-channel transistor 312. A gate of the p-channel transistor 310 is also coupled to the drain of the p-channel transistor 312 such that the p-channel transistors 310 and 312 are cross-coupled. An output of the inverter 344 is coupled to a drain of an n-channel transistor 346, and a source of the n-channel transistor 346 is coupled to the drain of the n-channel transistor 318 and a gate of the re-channel transistor 316. The drain of the n-channel transistor 316 is also coupled to a gate of the n-channel transistor 318 such that the n-channel transistors 316 and 318 are cross-coupled.

The logic 304 is enabled by the output enable signal OE and a timing signal DOUTLAT coupled to separate inputs of a NAND gate 350. The timing signal DOUTLAT may comprise a sequence of delayed pulses, as will be described below. An output of the NAND gate 350 is coupled to an input of an inverter 352 and an output of the inverter 352 is coupled to a gate of the n-channel transistor 320 in the latch 302. During operation, the NAND gate 350 can provide a latch-in signal LATIN on its output that is coupled to gates of the n-channel transistors 342 and 346 to switch them on to allow the outputs of the NAND gate 340 and the inverter 344 to be coupled to the latch 302.

Referring to FIG. 2, the data signal DATA is inverted four times between the line 270 and the external node 220. The data signal DATA is inverted once in the logic 304 and twice in the latch 302 to provide the control signal PUP, which can be an inverted form of the data signal DATA, as delayed by the timing signal DOUTLAT. The data signal DATA is also inverted by the transistors 210 and 230 in the driver circuit 200 before reaching the external node 220 such that the data signal DATA from the line 270 is reproduced on the external node 220.

Figure 4:
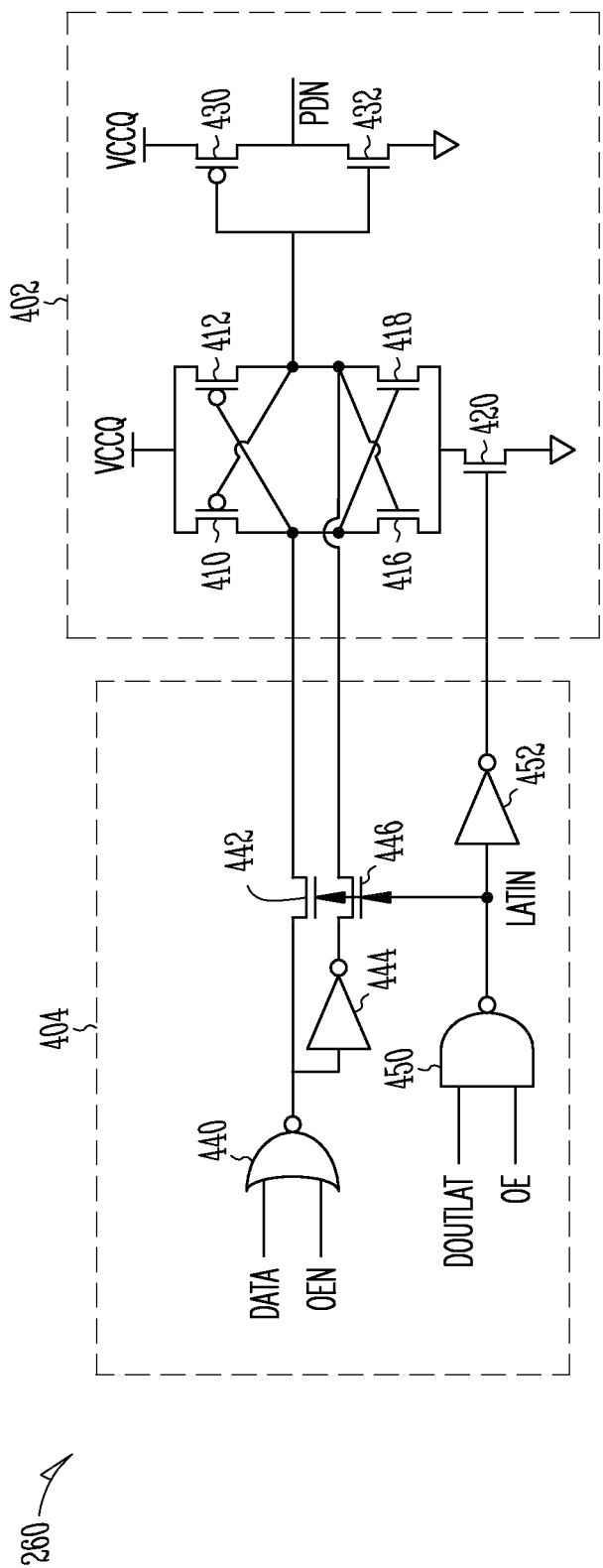
FIG. 4 is an electrical schematic diagram of an apparatus in the form of a pull-down circuit according to various embodiments of the invention.

FIG. 4 is an electrical schematic diagram of an apparatus in the form of the pull-down circuit 260 according to various embodiments of the invention. The pull-down circuit 260 is shown in FIG. 2 and includes a latch 402 and logic 404. The latch 402 includes a p-channel transistor 410 having a source coupled to a source of a p-channel transistor 412 and a VCCQ node. A drain of the p-channel transistor 410 is coupled to a drain of an n-channel transistor 416, and a drain of the p-channel transistor 412 is coupled to a drain of an n-channel transistor 418. Sources of the n-channel transistors 416 and 418 are coupled together to a drain of an n-channel transistor 420, and a source of the re-channel transistor 420 is coupled to a reference (e.g., ground voltage) node. The transistors 410, 412, 416 and 418 are cross-coupled to latch a potential from the logic 404 as described below.

During operation, the drains of the transistors 412 and 418 can have a latched potential that is coupled to gates of a p-channel transistor 430 and an n-channel transistor 432. A source of the p-channel transistor 430 is coupled to a VCCQ node and a drain of the p-channel transistor 430 is coupled to a drain of the n-channel transistor 432. A source of the n-channel transistor 432 is coupled to the reference node. The transistors 430 and 432 function as an inverter to invert the potential on the drains of the transistors 412 and 418 into a control signal PDN on the drains of the transistors 430 and 432. The latch 402 receives VCCQ while the logic receives VCCR (not shown).

The state of control signal PDN is determined by the state of the logic 404. The logic 404 includes a NOT OR (NOR) gate 440 that receives the data signal DATA and an output enable not signal OEN on separate inputs. An output of the NOR gate 440 is coupled to a drain of an n-channel transistor 442 and an input of an inverter 444. A source of the n-channel transistor 442 is coupled to the drain of the p-channel transistor 410 and a gate of the p-channel transistor 412. A gate of the p-channel transistor 410 is also coupled to the drain of the p-channel transistor 412 such that the p-channel transistors 410 and 412 are cross-coupled. An output of the inverter 444 is coupled to a drain of an n-channel transistor 446, and a source of the n-channel transistor 446 is coupled to the drain of the re-channel transistor 418 and a gate of the n-channel transistor 416. The drain of the re-channel transistor 416 is also coupled to a gate of the n-channel transistor 418 such that the n-channel transistors 416 and 418 are cross-coupled.

The logic 404 is enabled by the output enable signal OE and a timing signal DOUTLAT coupled to separate inputs of a NAND gate 450. An output of the NAND gate 450 is coupled to an input of an inverter 452 and an output of the inverter 452 is coupled to a gate of the n-channel transistor 420 in the latch 402. During operation, the NAND gate 450 can provide a latch-in signal LATIN on its output that is coupled to gates of the re-channel transistors 442 and 446 to switch them on to allow the outputs of the NOR gate 440 and the inverter 444 to be coupled to the latch 402.

Referring to FIG. 2, the data signal DATA is inverted four times between the line 270 and the external node 220. The data signal DATA is inverted once in the logic 404 and twice in the latch 402 to provide the control signal PDN, which can be an inverted form of the data signal DATA, as delayed by the timing signal DOUTLAT. The data signal DATA is also inverted by the transistors 210 and 230 in the driver circuit 200 before reaching the external node 220 such that the data signal DATA from the line 270 is reproduced on the external node 220.

Figure 5:
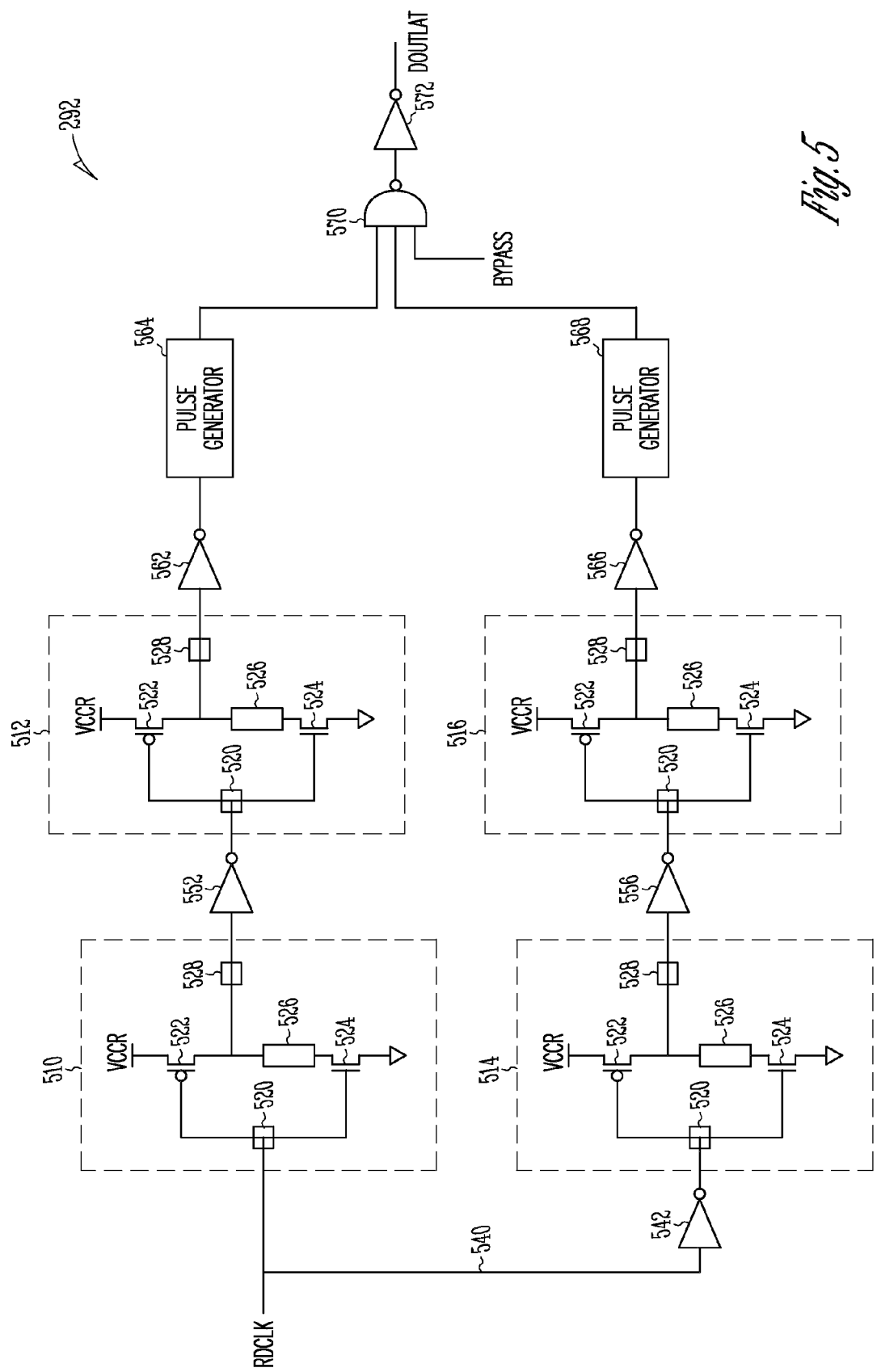
FIG. 5 is an electrical schematic diagram of an apparatus in the form of a timing circuit according to various embodiments of the invention.

FIG. 5 is an electrical schematic diagram of an apparatus in the form of a timing circuit 292 according to various embodiments of the invention. The timing circuit 292 is shown in FIG. 2 and includes four delay circuits 510, 512, 514 and 516. Each delay circuit 510, 512, 514 and 516 includes substantially the same features that are identified by the same reference numerals for purposes of brevity and clarity. Each delay circuit 510, 512, 514 and 516 has an input node 520 coupled to receive a signal. The input node 520 is coupled to gates of a p-channel transistor 522 and an n-channel transistor 524. A source of the p-channel transistor 522 is coupled to a VCCR node, and a drain of the p-channel transistor 522 is coupled to a first node of an adjustable delay element 526 and an output node 528. A drain of the n-channel transistor 524 is coupled to a second node of the adjustable delay element 526 and a source of the n-channel transistor 524 is coupled to a reference (e.g., ground voltage) node.

A RDCLK signal is received on a line 540 that is coupled to the input node 520 of the delay circuit 510 and to an input of an inverter 542. An output of the inverter 542 is coupled to the input node 520 of the delay circuit 514. The output node 528 of the delay circuit 510 is coupled to an input of an inverter 552, and an output of the inverter 552 is coupled to the input node 520 of the delay circuit 512. Similarly, the output node 528 of the delay circuit 514 is coupled to an input of an inverter 556, and an output of the inverter 556 is coupled to the input node 520 of the delay circuit 516. The output node 528 of the delay circuit 512 is coupled to an input of an inverter 562, and an output of the inverter 562 is coupled to an input of a pulse generator 564. The output node 528 of the delay circuit 516 is coupled to an input of an inverter 566, and an output of the inverter 566 is coupled to an input of a pulse generator 568.

The timing signal DOUTLAT may comprise a sequence of delayed pulses, the pulses being delayed according to the state of the adjustable delay elements 526 in the delay circuits 510, 512, 514 and 516. During operation of the timing circuit 292, the RDCLK signal is delayed by the delay circuits 510 and 512 and inverted by the inverters 552 and 562 before being turned into the delayed pulses by the pulse generator 564. The RDCLK signal is inverted by the inverter 542, and the inverted RDCLK signal is delayed by the delay circuits 514 and 516 and inverted by the inverters 556 and 566 before being turned into delayed pulses by the pulse generator 568. The delayed pulses provided by the pulse generators 564 and 568 are coupled to first and second inputs of a NAND gate 570. An output of the NAND gate 570 is coupled to an input of an inverter 572, and the delayed pulses of the timing signal DOUTLAT are provided at an output of the inverter 572. A pulse of the timing signal DOUTLAT is provided on each rising edge and each falling edge of the RDCLK signal.

A third input of the NAND gate 570 can receive the enable signal BYPASS that can be used to enable the timing circuit (e.g., to enable NAND gate 570 to provide the delayed pulses of the timing signal DOUTLAT). The NAND gate 570 is enabled to provide pulses when the enable signal BYPASS is high. The NAND gate 570 provides a logic high signal and the inverter 572 provides a logic low timing signal DOUTLAT when the enable signal BYPASS is low. The enable signal BYPASS is at a logic high during a first mode of operation (e.g. the DDR mode) to modulate the slew rate. The enable signal BYPASS is at a logic low during a second mode of operation (e.g. the SDR mode) to allow a signal to be driven on the external node 120 or the external node 220 without modulating the slew rate.

Each timing circuit 292 can provide the same timing signal DOUTLAT to a respective one of the pull-up circuits 150, 152, 154 and 156 and a respective one of the pull-down circuits 160, 162, 164 and 166 shown in FIG. 1. The timing signals DOUTLAT can be used to control the arrival times of a data signal at gates of the p-channel transistors 110, 112, 114 and 116 and the n-channel transistors 130, 132, 134 and 136. The arrival times of the data signal can be delayed such that the data signal arrives in a sequence at the gates of the p-channel transistors 110, 112, 114 and 116 and the n-channel transistors 130, 132, 134 and 136. Operation of the timing circuit 292 is further discussed below with respect to FIG. 8.

Figure 6:
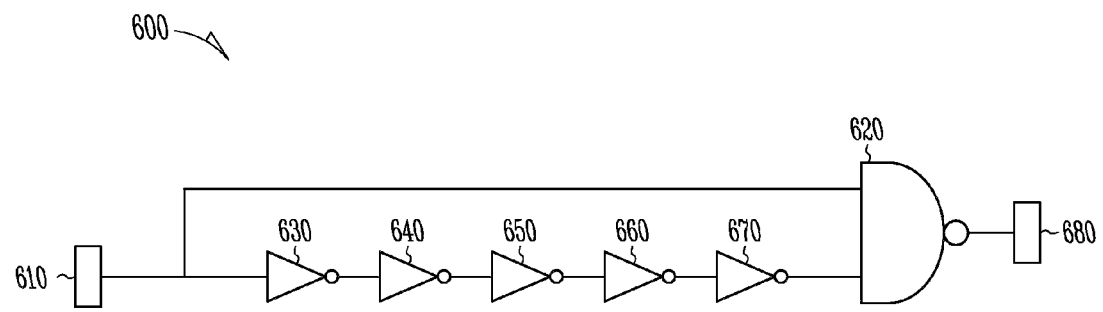
FIG. 6 is an electrical schematic diagram of an apparatus in the form of a pulse generator according to various embodiments of the invention.

FIG. 6 is an electrical schematic diagram of an apparatus in the form of a pulse generator 600 according to various embodiments of the invention. The pulse generator 600 includes an input node 610 that can receive a signal. The signal at the input node 610 can be a periodic signal such as a clock signal. The input node 610 is coupled to a first input of a NAND gate 620 and an input of an odd number of inverters 630, 640, 650, 660 and 670 coupled in series between the input node 610 and a second input of the NAND gate 620. The pulse generator 600 can provide a logic low pulse at an output node 680 of the NAND gate 620 when a logic low signal at the input node 610 transitions to a logic high signal. The first and second inputs of the NAND gate 620 have different values before the transition of the input node 610 to provide a high signal at the output node 680. When the logical low to high transition at the input node 610 occurs, both inputs of the NAND gate 620 are at a logic high until the inverters 630, 640, 650, 660 and 670 change state to provide a logic low signal to the second input of the NAND gate 620 to end the pulse. The NAND gate 620 provides the logic low pulse at the output node 680 while both inputs are at a logic high. The pulse generator 600 is an example of the pulse generators 564 and 568 shown in FIG. 5 according to various embodiments of the invention.

Figure 7:
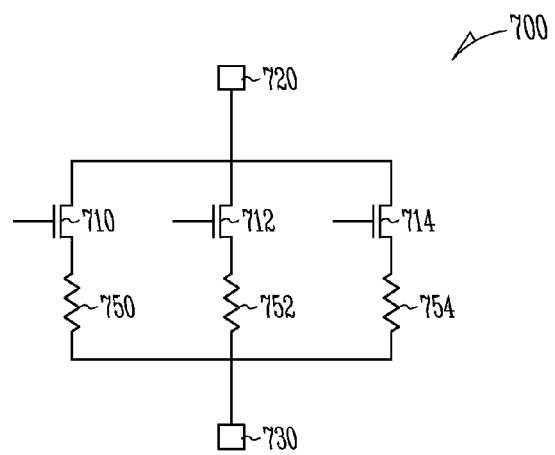
FIG. 7 is an electrical schematic diagram of an apparatus in the form of an adjustable delay element according to various embodiments of the invention.

FIG. 7 is an electrical schematic diagram of an apparatus in the form of an adjustable delay element 700 according to various embodiments of the invention. The adjustable delay element 700 includes three n-channel transistors 710, 712 and 714 coupled in parallel between an input node 720 and an output node 730. Each of the transistors 710, 712 and 714 is coupled in series with a respective resistor 750, 752 and 754 between the input node 720 and the output node 730. The adjustable delay element 700 presents an impedance between the input node 720 and the output node 730 determined by how many of the transistors 710, 712 and 714 are switched on. For each of the transistors 710, 712 and 714 that is switched on, the impedance between the input node 720 and the output node 730 decreases as does the delay of a corresponding delay circuit including the adjustable delay element 700. There may be more or fewer than three re-channel transistors and resistors coupled in parallel between the input node 720 and the output node 730. The adjustable delay element 700 is an example of the adjustable delay elements 526 shown in FIG. 5 according to various embodiments of the invention. Each of the delay circuits 510, 512, 514 and 516 delays a signal by an amount controlled by its respective adjustable delay element 526, and this delay may be changed during operation.

Figure 8:
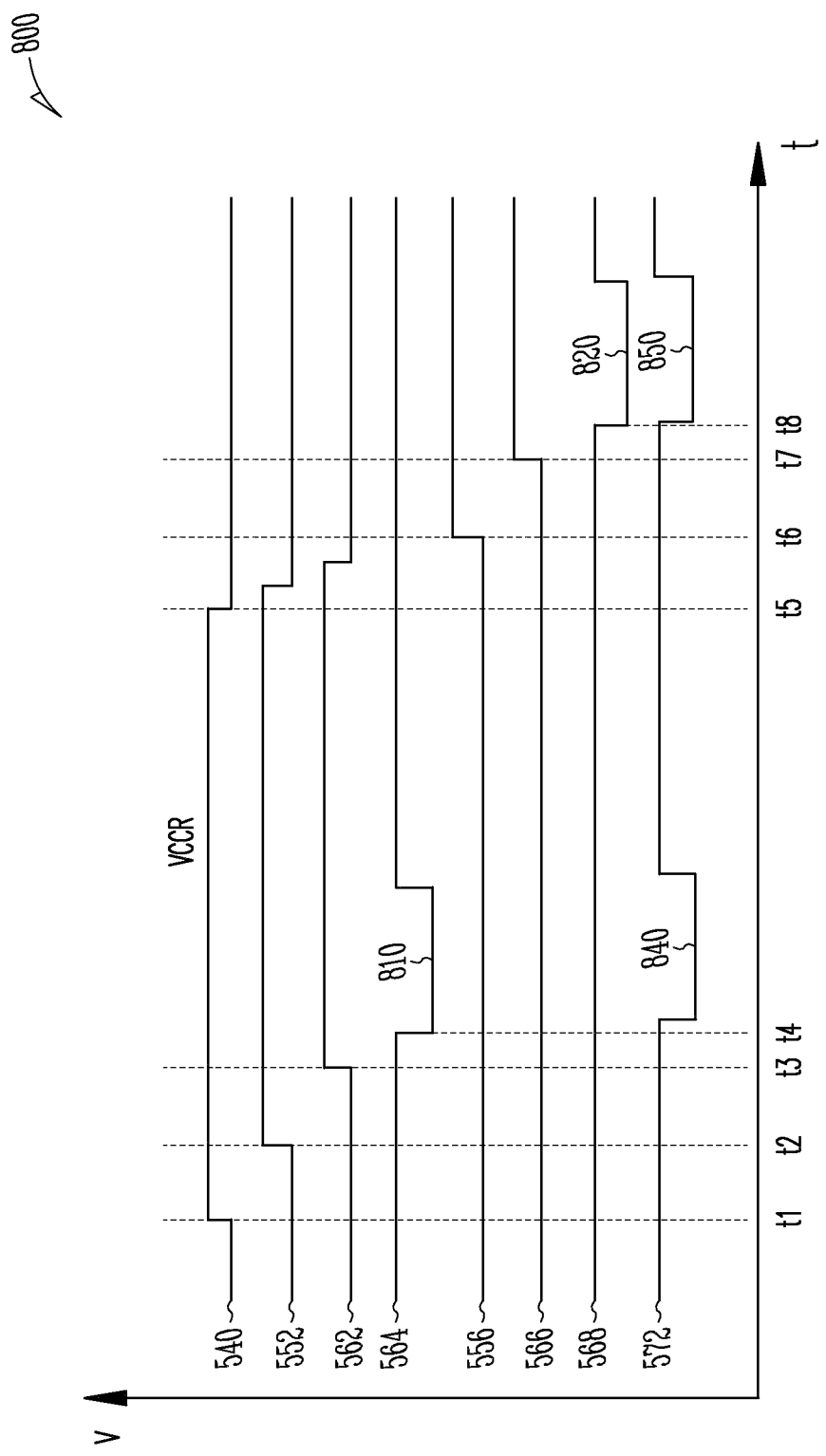
FIG. 8 is a timing diagram for a timing circuit according to various embodiments of the invention.

FIG. 8 is a timing diagram 800 for the timing circuit 292 according to various embodiments of the invention. The timing diagram 800 shows the provision of the timing signal DOUTLAT in response to receiving the RDCLK signal. The RDCLK signal on the line 540 transitions from logical low to high at a time t1. The transition of the RDCLK signal is delayed and inverted by the delay circuit 510 and inverted by the inverter 552 to result in a rising edge on an output of the inverter 552 at a time t2. The transition of the RDCLK signal is delayed and inverted by the delay circuit 512 and inverted by the inverter 562 to result in a rising edge on an output of the inverter 562 at a time t3. The rising edge at the output of the inverter 562 causes the pulse generator 564 to provide a logic low pulse 810 with a leading edge at a time t4 to the first input of the NAND gate 570.

The RDCLK signal on the line 540 transitions from logic high to logic low at a time t5. The outputs of the inverters 552 and 562 transition from logic high to logic low soon after the time t5. The RDCLK signal can be inverted by the inverter 542 into a rising signal on the input node 520 of the delay circuit 514 at the time t5. The logical low to high transition of the inverted RDCLK signal is delayed and inverted by the delay circuit 514 and inverted by the inverter 556 to result in a rising edge on an output of the inverter 556 at a time t6. The transition of the inverted RDCLK signal is delayed and inverted by the delay circuit 516 and inverted by the inverter 566 to result in a rising edge on an output of the inverter 566 at a time t7. The rising edge at the output of the inverter 566 causes the pulse generator 568 to provide a low pulse 820 with a leading edge at a time t8 to the second input of the NAND gate 570. The NAND gate 570 will provide a logic high pulse on an output during each low pulse provided by the pulse generators 564 and 568, and these pulses will be inverted by the inverter 572 into two low pulses 840 and 850 that are the timing signal DOUTLAT provided on an output of the inverter 572. The logic low pulses 840 and 850 of the timing signal DOUTLAT have edges that follow the edges of the pulses 810 and 820 received by the inverter 572. The logic low pulses 840 and 850 of the timing signal DOUTLAT follow the transition of the RDCLK signal on the line 540 at the time t1 by amounts of time that are determined by the state of the adjustable delay elements 526 in the delay circuits 510, 512, 514 and 516.

Figure 9:
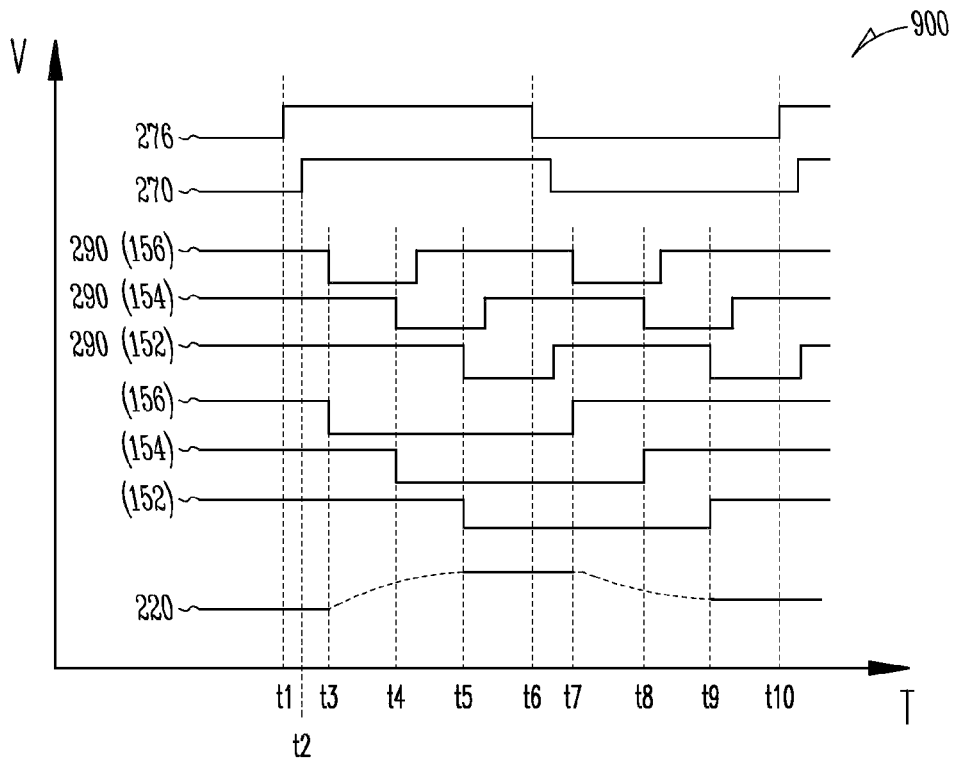
FIG. 9 is a timing diagram for a driver circuit according to the circuitry presented in FIGS. 1, 2 and 3.

FIG. 9 is a timing diagram 900 for the driver circuit 100 according to the circuitry presented in FIGS. 1, 2 and 3. The timing diagram 900 is valid when the output enable signal OE is at a logic high, the output enable not signal OEN is at a logic low and the timing circuit enable signal BYPASS is at a logic high. A leading edge of the data signal DATA on the line 270 rises at a time t2 that is delayed from the rising edge of the data signal DATA on the line 276 at time t1. The data signal DATA on the line 270 is delayed by the inverters 272 and 274 after having been received on the line 276. Timing signals DOUTLAT on the line 290 are shown for three of the pull-up circuits 152, 154 and 156, each having different delays from the rising data signal DATA at the time t1. The timing signal DOUTLAT for the pull-up circuit 156 begins a logic low pulse with a falling edge at a time t3. The timing signal DOUTLAT for the pull-up circuit 154 begins a logic low pulse with a falling edge at a time t4. The timing signal DOUTLAT for the pull-up circuit 152 begins a logic low pulse with a falling edge at a time t5. The pulses of the timing signal DOUTLAT for the pull-up circuits 152, 154 and 156 begin at different times that are determined by the state of the adjustable delay elements 526 in the separate timing circuits 292 of the pull-up circuits 152, 154 and 156. In other words, at least one of the timing signals provided to the pull-up circuits 152, 154, and 156 is delayed relative to another one of the timing signals.

With reference to FIG. 3, a logic high timing signal DOUT-LAT results in a logic low latch-in signal LATIN on the output of the NAND gate 350. The logic low latch-in signal LATIN switches off the transistors 342 and 346 to substantially block the data signal DATA from the latch 302. The inverted latch-in signal LATIN switches on the re-channel transistor 320 to provide the ground voltage to the transistors 316 and 318 in the latch 302 which retains the previously latched data signal DATA. A falling edge of the timing signal DOUTLAT raises the latch-in signal LATIN to switch on the transistors 342 and 346 and switch off the transistor 320 to allow the latch 302 to latch the current data signal DATA. The latched data signal DATA is transferred to the transistors 330 and 332 to provide the control signal PUP.

In response to the rising edge of the data signal DATA at the time t2, each of the control signals PUP provided to the gates of the p-channel transistors 112, 114 and 116 transitions low at substantially the same time as the respective timing signal DOUTLAT provided to the pull-up circuits 152, 154 and 156. The control signals PUP that transition low at substantially the same time may or may not transition low at exactly the same time. The control signal PUP provided by the pull-up circuit 156 to the gate of the p-channel transistor 116 transitions low at a time t3. The control signal PUP provided by the pull-up circuit 154 to the gate of the p-channel transistor 114 transitions low at the time t4, which is delayed from the time t3. The control signal PUP provided by the pull-up circuit 152 to the gate of the p-channel transistor 112 transitions low at the time t5, which is delayed from the time t4. A signal on the external node 120 rises between the times t3 and t5, remains at a logic high between the times t5 and t7, and falls between the times t7 and t9. In other words, the control signals provided by the pull-up circuits 156, 154 and 152 switch the p-channel transistors 116, 114 and 112 at different times to modulate a slew rate of the signal on the external node 120.

Figure 10:
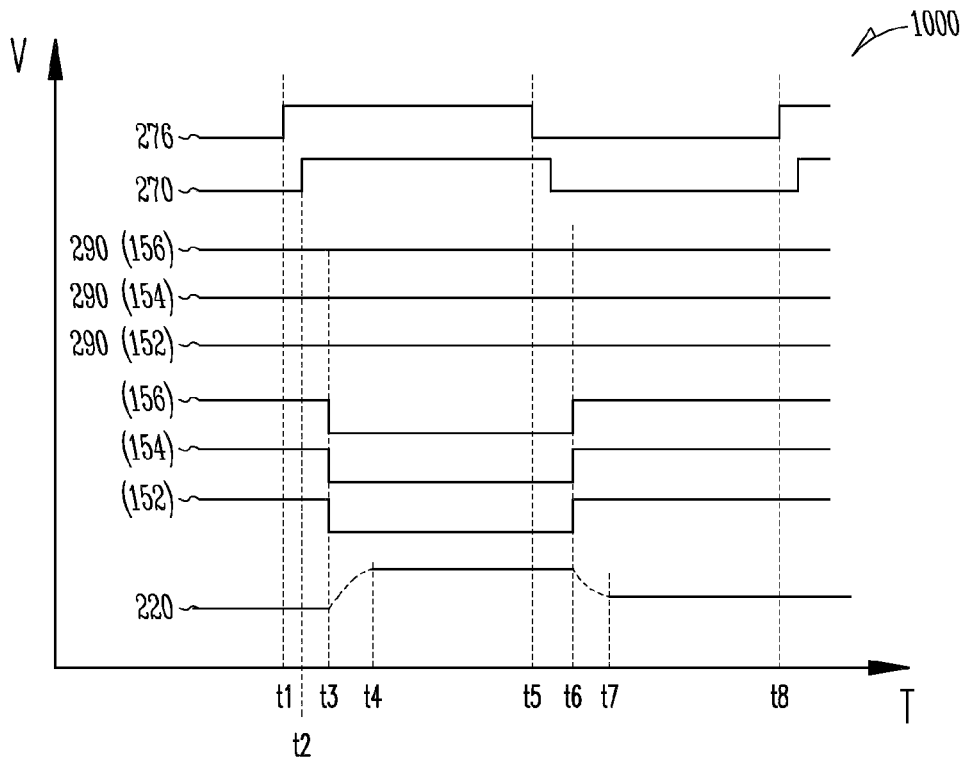
FIG. 10 is a timing diagram for a driver circuit according to the circuitry presented in FIGS. 1, 2 and 3.

FIG. 10 is a timing diagram 1000 for the driver circuit 100 according to the circuitry presented in FIGS. 1, 2 and 3. The timing diagram 1000 is valid when the output enable signal OE is high, the output enable not signal OEN is low and the enable signal BYPASS is low. The low enable signal BYPASS disables the timing circuit 292 which disables the timing signal DOUTLAT such that the slew rate for the signal on the external node 120 is not modulated. The disabled timing signal DOUTLAT is always low.

A leading edge of the data signal DATA on the line 270 rises at a time t2 that is delayed from the rising edge of the data signal DATA on the line 276 at time t1. Timing signals DOUTLAT provided by the pull-up circuits 152, 154 and 156 are at a logic low due to the logic low enable signal BYPASS. Accordingly, the timing signals are not delayed relative to each other. With reference to FIG. 3, providing a logic low timing signal DOUTLAT to a pull-up circuit results in a logic high latch-in signal LATIN that switches on the transistors 342 and 346 and switches off the transistor 320 to allow the latch 302 to latch the current data signal DATA. The latched data signal DATA is transferred to the transistors 330 and 332 to provide the respective control signal PUP.

In response to the rising edge of the data signal DATA at the time t2, pull-up circuits 156, 154, and 152 provide control signals to the gates of the p-channel transistors 112, 114 and 116 that transition low at substantially the same time t3. In other words, the control signals provided to the gates of the p-channel transistors 112, 114 and 116 are not delayed relative to each other. Accordingly, the slew rate of a signal on the external node 120 is not modulated, and the signal rises between times t3 and t4, remains at a logic high between times t4 and t6, and falls between times t6 and t7. The slew rate for the signal on the external node 120 is higher in FIG. 10 when the enable signal BYPASS is at a logic low than the slew rate in FIG. 9 when the enable signal BYPASS is at a logic high.

The operation of the pull-down circuit 260 shown in FIG. 4 is analogous to the operation of the pull-up circuit 250 shown in FIG. 3 and will not be further described for purposes of brevity and clarity.

Figure 11:
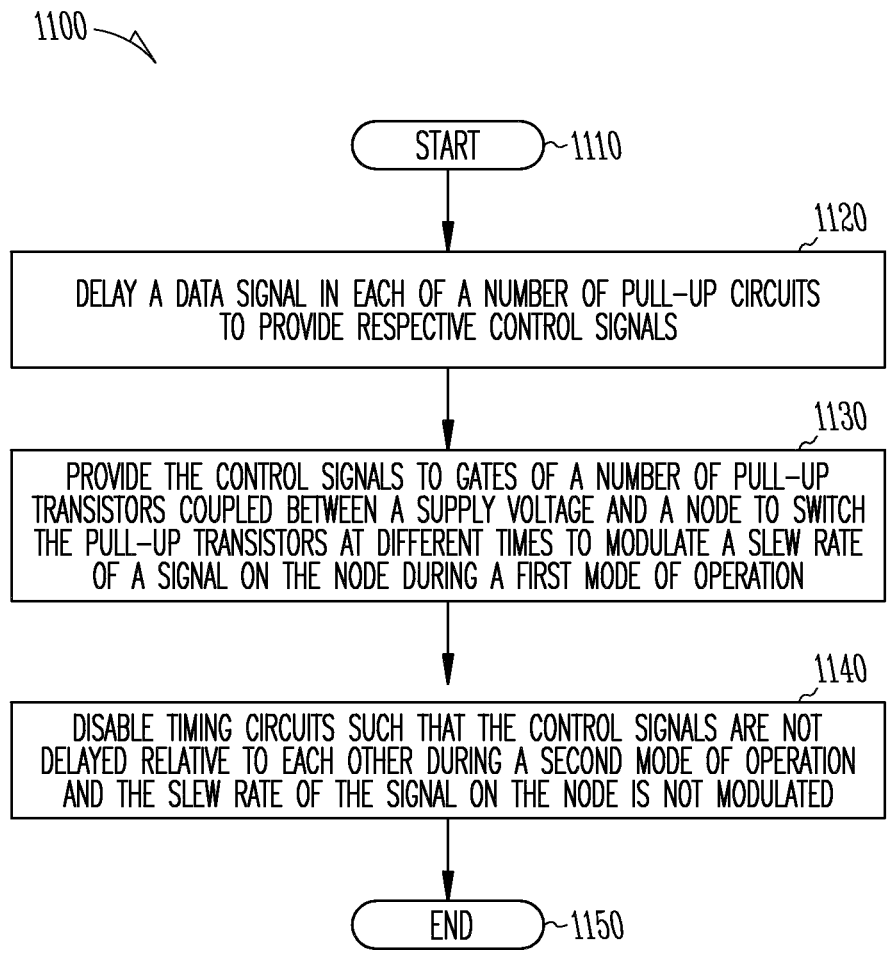
FIG. 11 is a flow diagram of one method according to various embodiments of the invention.

FIG. 11 is a flow diagram of one method 1100 according to various embodiments of the invention. In block 1110, the method 1100 begins. In block 1120, each of a number of pull-up circuits respectively delay a data signal to provide a respective control signal, wherein at least one of the control signals is delayed relative to another one of the control signals. In block 1130, the control signals are provided to gates of a number of pull-up transistors coupled between a supply voltage and a node to switch the pull-up transistors at different times to modulate a slew rate of a signal on the node during a first mode of operation. In block 1140, timing circuits are disabled such that the control signals are not delayed relative to each other during a second mode of operation, wherein the slew rate of the signal on the node is not modulated during the second mode of operation. In block 1150, the method 1100 ends. Various embodiments may have more or fewer activities than those shown in FIG. 11. The activities shown may be accomplished in the illustrated order, or in another order. Some activities may be substituted for others.

Figure 12:
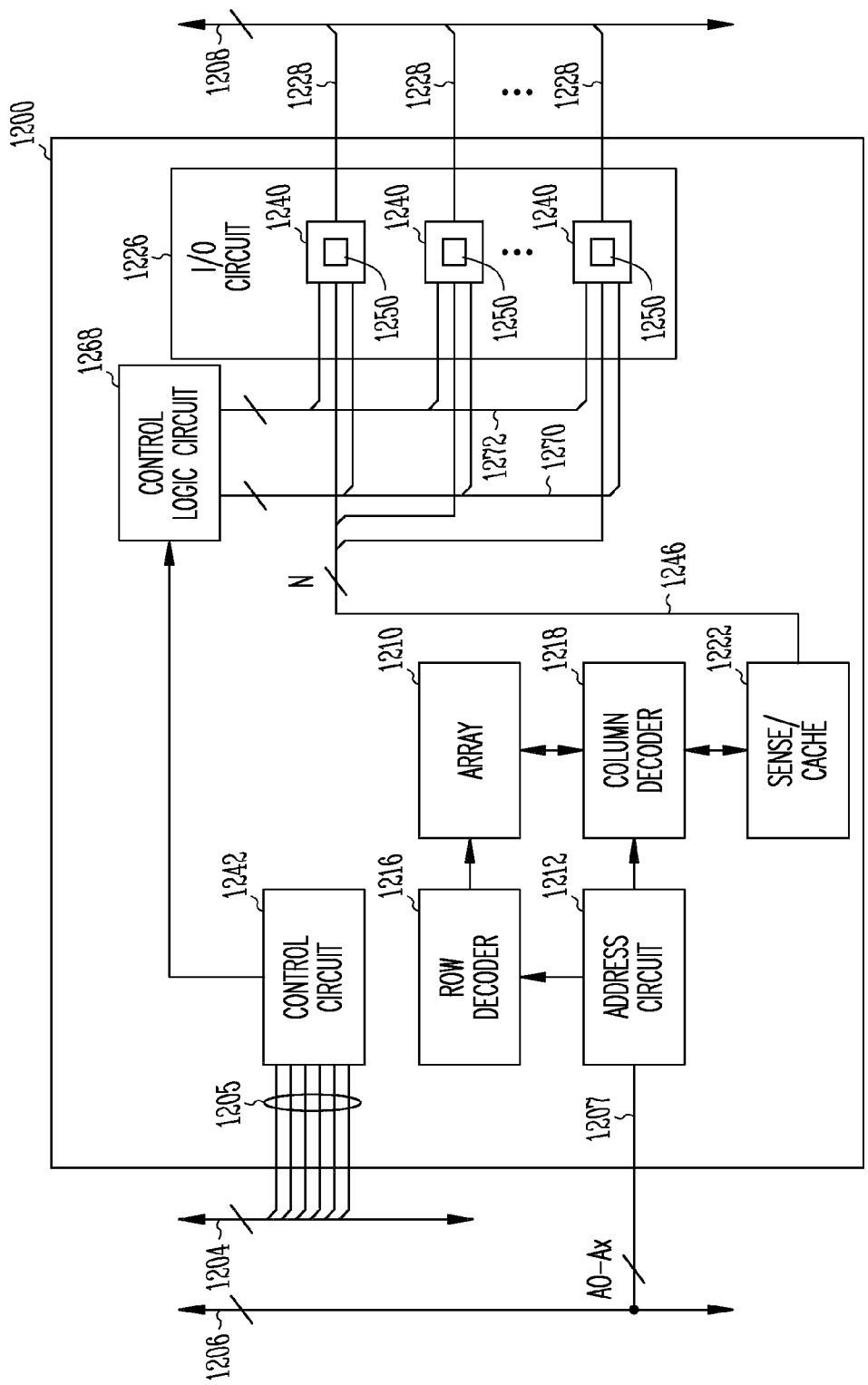
FIG. 12 is a block diagram of an apparatus in the form of a memory device according to various embodiments of the invention.

FIG. 12 is a block diagram of an apparatus in the form of a memory device 1200 according to various embodiments of the invention. The memory device 1200 is coupled to a control bus 1204 to receive multiple control signals over control signal lines 1205. The memory device 1200 is also coupled to an address bus 1206 to receive address signals A0-Ax on address signal lines 1207 and to a data bus 1208 to transmit and receive data signals. Although depicted as being received on separate physical busses, the signals could also be multiplexed and received on the same physical bus.

The memory device 1200 includes one or more arrays 1210 of memory cells that can be arranged in rows and in columns. The memory cells of the array 1210 can be non-volatile memory cells (e.g., Flash memory cells) according to various embodiments of the invention. The memory device 1200 can be a NAND memory device. The array 1210 can include multiple banks and blocks of memory cells residing on a single die or on multiple dice as part of the memory device 1200. The memory cells in the array 1210 can be single level (SLC) or multilevel (MLC) memory cells.

An address circuit 1212 can latch the address signals A0-Ax received on the address signal lines 1207. The address signals A0-Ax can be decoded by a row decoder 1216 and a column decoder 1218 to access data stored in the array 1210. The memory device 1200 can read data in the array 1210 by sensing voltage or current changes in memory cells in the array 1210 using sense devices in a sense/cache circuit 1222.

A data input and output (I/O) circuit 1226 implements bi-directional data communication over external (e.g., data I/O) nodes 1228 coupled to the data bus 1208. The I/O circuit 1226 includes N driver and receiver circuits 1240 according to various embodiments of the invention. The memory device 1200 includes a controller that is configured to support operations of the memory device 1200, such as writing data to and/or erasing data from the array 1210. The controller can comprise, for example, control circuitry 1242 (e.g., configured to implement a state machine) on a same or different die than that which includes the memory array 1210 and/or any or all of the other components of the memory device 1200. The controller can comprise the control circuitry 1242, firmware, software or combinations of any or all of the foregoing. Data including the data signal DATA can be transferred between the sense/cache circuit 1222 and the I/O circuit 1226 over N signal lines 1246.

Each driver and receiver circuit 1240 includes a driver circuit 1250 such as one or both of the driver circuits 100 and 200, shown in FIGS. 1 and 2, respectively. Control signals can be provided to the driver circuits 1250 (e.g., through control logic circuit 1268 that is coupled to the control circuitry 1242). The control logic circuit 1268 can provide the control signals over lines 1270 and 1272 to the driver circuits 1250. The control signals provided by the control logic circuit 1268 can include the enable signal BYPASS, the output enable signal OE, the output enable not signal OEN and the RDCLK signal.

Figure 13:
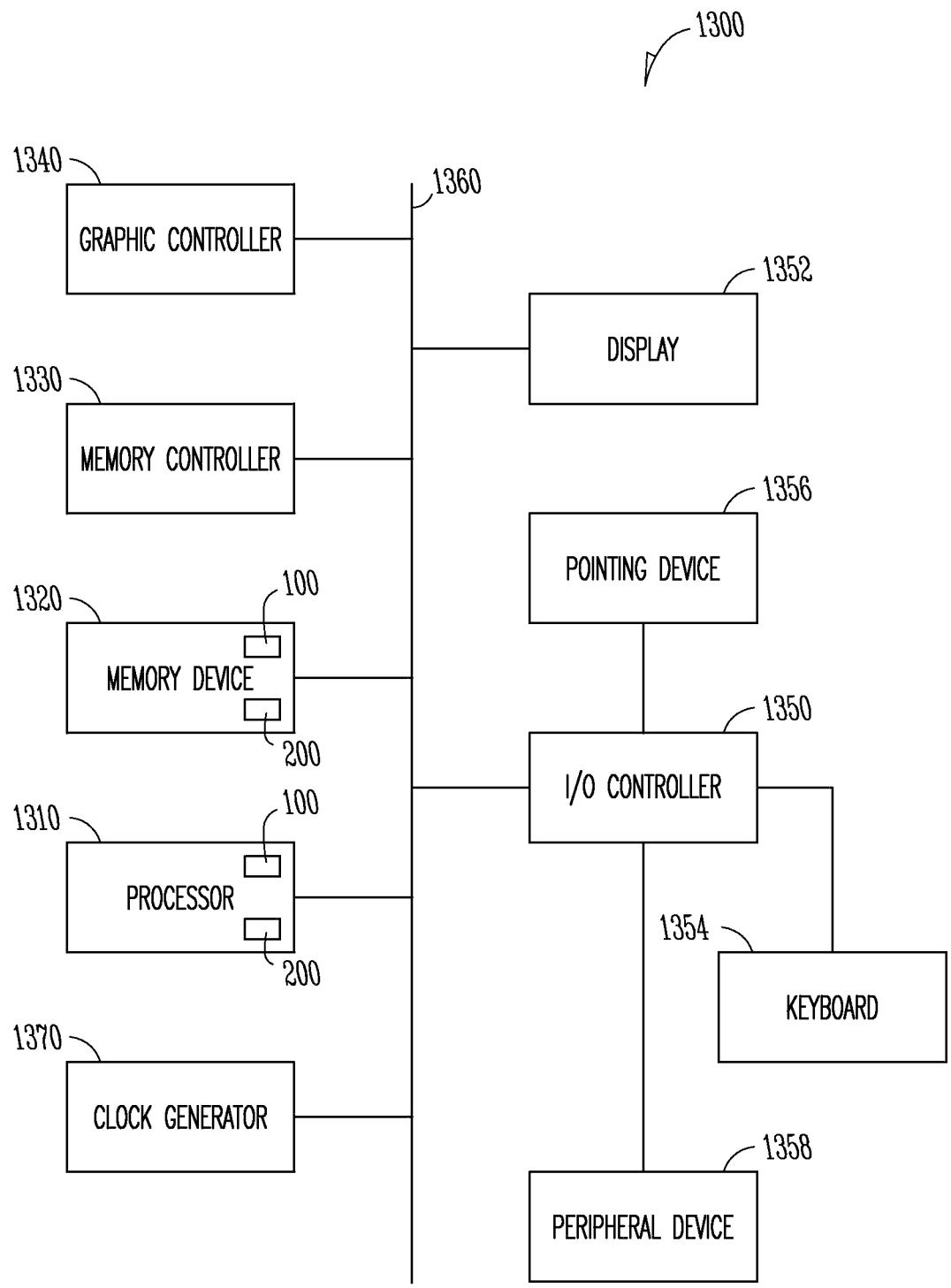
FIG. 13 is a block diagram of an apparatus in the form of a system according to various embodiments of the invention.

FIG. 13 is a block diagram of an apparatus in the form of a system 1300 according to various embodiments of the invention. The system 1300 may include a processor 1310, a memory device 1320, a memory controller 1330, a graphic controller 1340, an input and output (I/O) controller 1350, a display 1352, a keyboard 1354, a pointing device 1356, and a peripheral device 1358. A bus 1360 couples all of these devices together.

A clock generator 1370 can be coupled to the bus 1360 to provide a clock signal to at least one of the devices of the system 1300 through the bus 1360. The clock generator 1370 may include an oscillator in a circuit board such as a motherboard. Two or more devices shown in system 1300 may be formed in a single integrated circuit chip.

The memory device 1320 may be a NAND memory device according to various embodiments of the invention. The memory device 1320 includes a driver circuit such as one or both of the driver circuits 100 and 200 shown in FIGS. 1 and 2 respectively, according to various embodiments of the invention. The processor 1310 includes a driver circuit such as one or both of the driver circuits 100 and 200 shown in FIGS. 1 and 2 respectively, according to various embodiments of the invention. The bus 1360 may be used to interconnect traces on a circuit board and may comprise one or more cables. The bus 1360 may couple the devices of the system 1300 by wireless mechanisms, such as by electromagnetic radiation, for example, radio waves. The peripheral device 1358 coupled to the I/O controller 1350 may be a printer, an optical device such as a CD-ROM and a DVD reader and writer, a magnetic device reader and writer such as a floppy disk driver, or an audio device such as a microphone.

The system 1300 represented by FIG. 13 may include computers (e.g., desktops, laptops, hand-helds, servers, network appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio 3) players, video games, watches, etc.), and the like.

The various embodiments of the invention described herein and shown in FIGS. 1-13 can improve data access time and slew rate modulation. The slew rate obtained can be more consistent when it is modulated by more than one device and is not the result of a rising or falling control signal that can be skewed. The slew rate modulation can be disabled in some modes, such as the SDR mode, when it is not required. Faster data access times are possible in the SDR mode when the slew rate modulation can be disabled. The slew rate modulation can be temporarily disabled for a device that is switched between the SDR mode and the DDR mode on the fly.

Example driver apparatus and methods of operating driver circuits have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. .sctn.1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features can be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A memory, comprising:
  a plurality of memory cells; and
  an input/output circuit coupled to the plurality of memory cells, and configured to drive data from at least one of the plurality of memory cells onto a data node, the input/output circuit comprising:
    a plurality of pull-up transistors coupled between a first node and the data node;
    a plurality of pull-up circuits configured to receive a data signal, each of the plurality of pull-up circuits including a transistor configured to provide the data signal to a latch responsive to a respective timing signal and wherein each pull-up circuit of the plurality of pull-up circuits is further configured to provide a respective control signal from the latch to a gate of a respective pull-up transistor of the plurality of pull-up transistors responsive to the data signal and the respective timing signal, wherein the respective pull-up transistor is configured to switch responsive to the respective control signal; and
    a plurality of timing circuits coupled to the plurality of pull-up circuits, each of the plurality of timing circuits configured to provide the respective timing signal to a respective one of the plurality of pull-up circuits, and wherein the plurality of timing circuits are configured to provide the timing signals to cause the plurality of pull-up circuits to provide the respective control signals to switch the pull-up transistors at different times to modulate a slew rate of a signal on the data node.

2. The memory of claim 1, wherein each of the plurality of timing circuits comprise a plurality of adjustable delays coupled to a pulse generator, wherein the plurality of adjustable delays and the pulse generator are configured to receive a clock signal and provide the respective timing signal having a delay.

3. The memory of claim 1, wherein the input/output circuit further comprises:
  a plurality of pull-down transistors coupled between a second node and the data node; and
  a plurality of pull-down circuits configured to receive the data signal, each of the plurality of pull-down circuits including a transistor configured to provide the data signal to a latch responsive to a respective timing signal, and wherein each pull-down circuit of the plurality of pull-down circuits is further configured to provide a respective control signal from the latch to a gate of a respective one of the plurality of pull-down transistors responsive to the data signal and the respective timing signal, wherein the respective pull-down transistor is configured to switch responsive to the respective control signal, wherein each of the plurality of timing circuits is configured to provide the respective timing signal to a respective one of the plurality of pull-down circuits, and wherein the plurality of timing circuits are configured to provide the timing signals to cause the plurality of pull-down circuits to provide the respective control signals to switch the pull-down transistors at different times to modulate the slew rate of the signal on the data node.

4. The memory of claim 3, wherein each of the plurality of timing circuits is configured to provide the same timing signal to a respective one of the pull-up circuits and a respective one of the pull-down circuits.

5. The memory of claim 3, wherein:
each of the plurality of pull-up transistors comprises a p-channel transistor;
each of the plurality of pull-down transistors comprises an n-channel transistor; and
the first node comprises a supply voltage node and the second node comprises a ground node.

6. The memory of claim 1, wherein each of the plurality of timing circuits is configured to be disabled to prevent slew rate of a signal on the data node from being modulated.

7. A memory comprising:
a plurality of memory cells;
a driver circuit coupled to the plurality of memory cells, the driver circuit configured to drive data from the plurality of memory cells onto a data node based at least in part on a control signal, the driver circuit comprising:
a plurality of pull-up transistors coupled between a first node and the data node; and
a plurality of pull-up circuits configured to receive a data signal, each of the plurality of pull-up circuits including a transistor configured to provide the data signal to a latch responsive to a respective timing signal and wherein each of the plurality of pull-up circuits is further configured to provide a respective control signal to a gate of a respective pull-up transistor of the plurality of pull-up transistors responsive to the data signal and the respective timing signal, wherein the respective pull-up transistor of the plurality of pull-up transistors is configured to switch responsive to the respective control signal; and
a plurality of timing circuits coupled to the plurality of pull-up circuits, each one of the plurality of timing circuits configured to provide the respective timing signal to a respective one of the plurality of pull-up circuits, and wherein each of the plurality of timing circuits is configured to provide the respective timing signals to cause the plurality of pull-up circuits to provide the control signals to switch the pull-up transistors at different times to modulate a slew rate of a signal on the data node.

8. The memory of claim 7, wherein the driver circuit further comprises:
a plurality of pull-down transistors coupled between a second node and the data node; and
a plurality of pull-down circuits configured to receive the data signal, each of the plurality of pull-down circuits is configured to provide the data signal to a latch responsive to a respective timing signal, and wherein each of the plurality of pull-down circuits is further configured to provide a respective control signal to a gate of a respective pull-down transistor of the plurality of pull-down transistors responsive to the data signal and the respective timing signal, wherein the respective pull-down transistor of the plurality of pull-down transistors is configured to switch responsive to the respective control signal, wherein each of the plurality of timing circuits is configured to provide the respective timing signal to a respective one of the pull-down circuits, and wherein each of the plurality of timing circuits is configured to provide the timing signals to cause the plurality of pull-down circuits to provide the control signals to switch the pull-down transistors at different times to modulate the slew rate of the signal on the data node.

9. The memory of claim 7, wherein each of the plurality of timing circuits is configured to provide the respective timing signal based on a bypass signal, a read clock signal, and combinations thereof.

10. The memory of claim 9, wherein the bypass signal disables slew rate modulation.

11. The memory of claim 7, wherein the plurality of memory cells comprises a plurality of nonvolatile memory cells.

12. The memory of claim 7, wherein the plurality of memory cells comprises a plurality of volatile memory cells.

13. The memory of claim 7, wherein the driver circuit comprises a driver and receiver circuit.

14. A system, comprising:
a processor; and
a memory coupled to the processor, the memory comprising:
a plurality of memory cells; and
a driver circuit coupled to the plurality of memory cells, the driver circuit configured to drive data from at least one of the plurality of memory cells onto a data node, the driver circuit comprising:
a plurality of pull-up transistors coupled between a first node and the data node;
a plurality of pull-up circuits configured to receive a data signal, each of the plurality of pull-up circuits is configured to latch the data signal responsive to a respective timing signal and wherein each of the plurality of pull-up circuits is further configured to provide a respective control signal to a gate of a respective pull-up transistor of the plurality of pull-up transistors responsive to the data signal, an output enable signal, and the respective timing signal, wherein the respective pull-up transistor of the plurality of pull-up transistors is configured to switch responsive to the respective control signal; and
a plurality of timing circuits coupled to the plurality of pull-up circuits, each of the plurality of timing circuits configured to provide the respective timing signal to a respective one of the pull-up circuits responsive to a clock signal, and wherein each of the plurality of timing circuits is configured to provide the respective timing signals to cause the plurality of pull-up circuits to provide the control signals to switch the pull-up transistors at different times to modulate a slew rate of a signal on the data node.

15. The system of claim 14, wherein the driver circuit further comprises:
a plurality of pull-down transistors coupled between a second node and the data node; and
a plurality of pull-down circuits configured to receive the data signal, each of the plurality of pull-down circuits configured to latch the data signal responsive to a respective timing signal, and wherein each pull-down circuit is further configured to provide a respective control signal to a gate of a respective pull-down transistor of the pull-down transistors responsive to the data signal, a complement of the output enable signal, and the respective timing signal, wherein the respective pull-down transistor of the plurality of pull-down transistors is configured to switch responsive to the respective control signal, wherein each of the plurality of timing circuits is configured to provide the respective timing signal to a respective one of the pull-down circuits, and wherein each of the plurality of timing circuits is configured to provide the respective timing signals to cause the plurality of pull-down circuits to provide the control signals to switch the pull-down transistors at different times to modulate the slew rate of the signal on the data node.

16. The system of claim 15, logic, wherein the control logic circuit is configured to provide the output enable signal, the complement of the output enable signal, and the clock signal.

17. The system of 15, further including control logic, wherein the control logic is configured to provide a bypass signal to each of the plurality of timing circuits to disable slew rate modulation.

18. The system of claim 15, wherein each of the plurality of pull-down circuits includes a latch configured to latch the data signal.

19. The system of claim 14, wherein the each of the plurality of pull-up circuits includes a latch configured to latch the data signal.

20. The system of claim 14, where in the plurality of memory cells comprise a plurality of NAND memory cells.

* * * * *